United States Patent [19]

Harford

[11] 4,342,005
[45] Jul. 27, 1982

[54] TELEVISION INTERMEDIATE FREQUENCY AMPLIFIER WITH FEEDBACK STABILIZATION

[75] Inventor: Jack R. Harford, Flemington, N.J.
[73] Assignee: RCA Corporation, New York, N.Y.
[21] Appl. No.: 163,144
[22] Filed: Jun. 26, 1980
[51] Int. Cl.³ .............................................. H03G 3/30
[52] U.S. Cl. ................................... 330/254; 330/259; 358/174
[58] Field of Search ................. 330/96, 133, 254, 259, 330/283, 284; 358/174–179; 455/241, 249, 250, 251

[56] References Cited

U.S. PATENT DOCUMENTS 3,331,028  7/1967  Bay et al. ........................ 330/284 X
4,293,822 10/1981  McFadyen ...................... 330/259 X

FOREIGN PATENT DOCUMENTS 54-3451  1/1979  Japan .................................. 330/259

OTHER PUBLICATIONS

*Phillips Technical Information* 034, TDA2540 and TDA2541, Aug. 18, 1977.
Monolithic TV IF System TBA 440 by E. Schatter, pub. in IEEE Transactions on Broadcast & Television Receivers, Aug. 1972, vol. BTR-18, beginning on p. 158.

*Primary Examiner*—James B. Mullins
*Attorney, Agent, or Firm*—Paul J. Rasmussen; William H. Meagher; W. Brinton Yorks, Jr.

[57] ABSTRACT

An I.F. amplifier is provided in which gain control is accomplished by varying the A.C. impedances of variable impedance devices, which devices are coupled as load and emitter degeneration impedances for amplifying transistors. Variable D.C. gain control currents are applied to the variable impedance devices to vary their impedance. Substantially all of the D.C. gain control currents flow through the variable impedance devices in current paths which are separate from the amplifying transistors, thereby avoiding variation of the operating points of the amplifying transistors. The I.F. amplifier includes a D.C. feedback path which does not require the use of feedback amplification, due to the lack of any changes in the operating points of the amplifying stages during gain control. Elimination of the need for feedback amplification also prevents the introduction of noise into the amplified I.F. signals.

6 Claims, 1 Drawing Figure

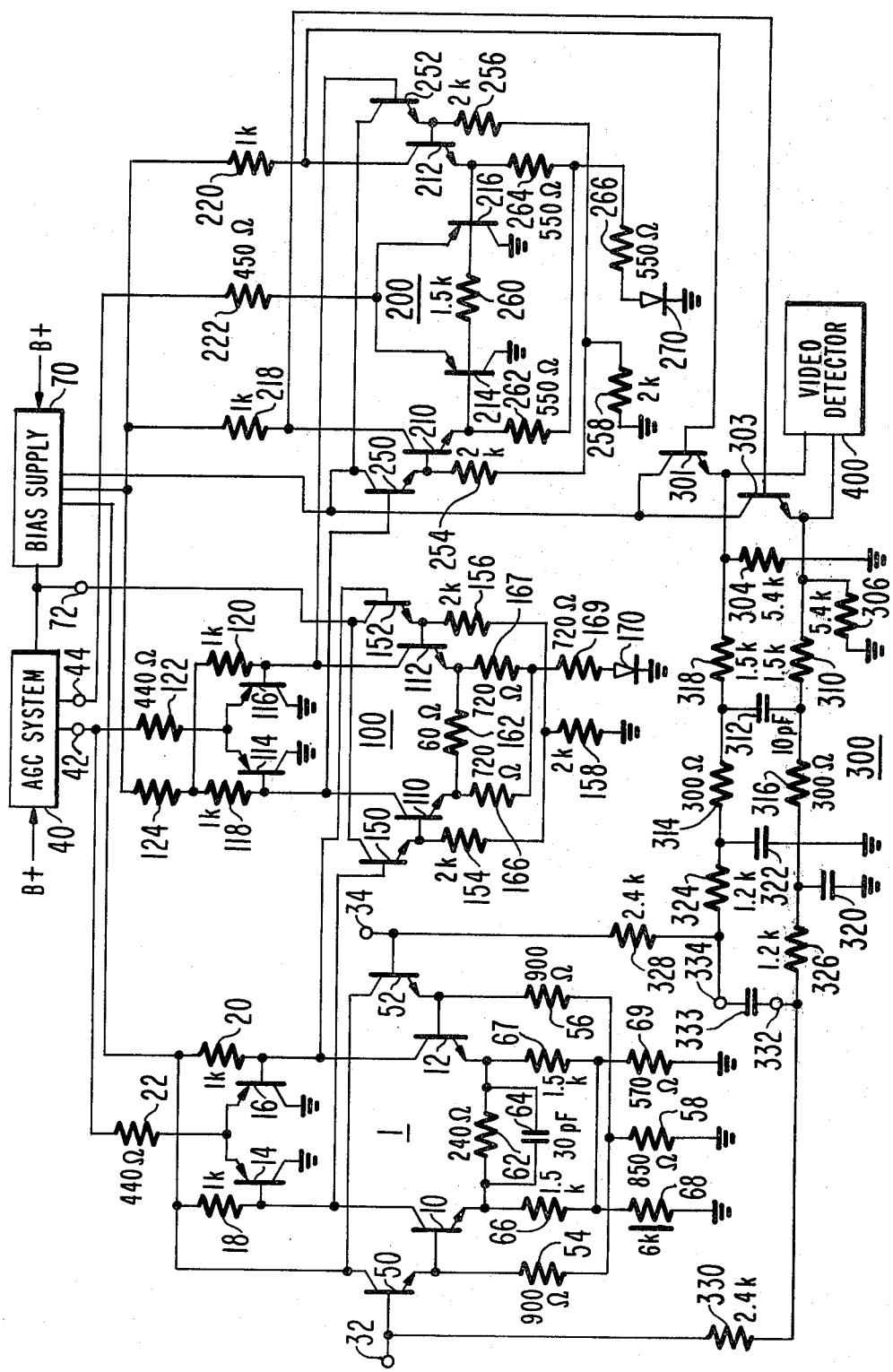

TELEVISION INTERMEDIATE FREQUENCY AMPLIFIER WITH FEEDBACK STABILIZATION

This invention relates to television intermediate frequency (I.F.) amplifiers and, in particular, to a multistage I.F. amplifier in which two techniques of gain control are advantageously combined to produce a high gain amplification system utilizing a simplified feedback path for D.C. stabilization.

In a conventional television I.F. amplifying section, several amplifier stages are usually cascaded to provide high amplification for the I.F. signal which is received from the tuner and mixer circuitry. Since the received I.F. signal may be of varying signal strength, one or more of the amplifier stages is generally gain controlled, so that the final I.F. amplifier stage will provide a substantially constant strength signal to the video detector.

However, as the gain of the gain controlled stage or stages is varied by the usual techniques of forward or reverse gain control, the operating points of the amplifier stages are unavoidably changed as the D.C. currents conducted by the amplifier stages change. These D.C. operating point shifts will be applied to subsequent stages in the amplifier when the amplifiers are direct current coupled to each other, which is the conventional technique currently in use. This will result in undesirable alteration of the operating points of the subsequent stages, as the changing D.C. currents are propagated through the cascaded amplifier stages. Furthermore, the D.C. currents will cause changes in the D.C. level of the amplified signal, which can adversely affect the operation of the video detector. It is therefore desirable for the I.F. amplifier to be gain controlled in a manner which avoids shifts in the operating points of the amplifying devices.

In accordance with the principles of the present invention, an I.F. amplifier is provided in which gain control is accomplished by varying the A.C. impedances of variable impedance devices, which devices are coupled as load and emitter degeneration impedances for amplifying transistors. Variable D.C. gain control currents are applied to the variable impedance devices to vary their impedance. Substantially all of the D.C. gain control currents flow through the variable impedance devices in current paths which are separate from the amplifying transistors, thereby avoiding variation of the operating points of the amplifying transistors. Since the operating points of the various stages are substantially unaffected during gain control, the individual stages may be designed to operate at optimum, substantially unvarying bias points.

In order to stabilize the operating points of the amplifying stages in I.F. amplifiers against changes such as those due to the aforementioned D.C. shifts, as well as temperature induced shifts and variation in device characteristics from one amplifier to another, a D.C. feedback path is generally coupled between the first and last amplifying stages. The complexity of the D.C. feedback path is dependent upon the magnitude of D.C. correction which the amplifiers are expected to require for stable operation. In some I.F. amplifiers, such as the one used in the TDA2540 TV I.F. IC, the D.C. gain of the I.F. amplifier and feedback loop is relatively low. This can result in insufficient D.C. feedback under certain low gain operating conditions. In order to provide the required amount of feedback, a separate amplifier is coupled in its own feedback loop at the output of the final I.F. stage. This amplifier is used to provide the required amount of feedback for the I.F. system, which prevents a lockout condition from occurring during channel switching. Pursuant to the principles of the present invention, the I.F. amplifier includes a D.C. feedback path which does not require the use of such a feedback amplifier, due to the lack of any changes in the operating points of the amplifying stages during gain control. Elimination of the feedback amplifier also prevents the introduction of noise into the amplified I.F. signals by this amplifier.

The sole drawing FIGURE illustrates in schematic and block diagram form a three stage I.F. amplifier constructed in accordance with the principles of the present invention.

Referring to the drawing, three differential I.F. amplifier stages 1, 100 and 200 are coupled in cascade, with a feedback path 300 coupled between the third and first stages 200 and 1. The three stages are gain controlled by control currents supplied by an AGC system 40, and bias voltages for the system are provided by a bias supply 70.

A push-pull video I.F. signal is applied across input terminals 32 and 34, which are coupled to the bases of buffer transistors 50 and 52 of the first stage 1. The collectors of the buffer transistors 50 and 52 are coupled to the bias supply 70, and their respective emitter electrodes are coupled to the bases of amplifying transistors 10 and 12. Biasing for the emitter-base connections of transistors 50 and 10, and 52 and 12, is provided by resistors 54, 56 and 58. A D.C. ground return path for the emitters of transistors 10 and 12 is provided by resistors 66, 67 and 69, and pinch resistor 68. The pinch resistor 68 is also used to stabilize beta variations in the transistors of the first stage, which variations may occur from one circuit to another during volume production of the amplifier in integrated circuit form.

The A.C. emitter impedance of transistors 10 and 12 is dominated by a resistor 62 and a peaking capacitor 64, which are coupled in parallel between the emitters of the transistors. Each amplifying transistor 10 or 12 has a load impedance comprising a resistor 18 or 20 coupled between the collector of the respective transistor and the bias supply 70, and a variable impedance device. The collector of transistor 10 is coupled to the base of a variable impedance device 14, and the collector of transistor 12 is coupled to the base of a variable impedance device 16. The variable impedance devices 14 and 16 have collectors which are coupled to a reference potential (ground) and joined emitters, which are coupled to receive control current from the AGC system 40 by way of a resistor 22.

The output signals at the collectors of the amplifying transistors 10 and 12 are direct current coupled to the bases of buffer transistors 150 and 152 of the second amplifying stage 100. The second amplifying stage 100 is constructed in a similar manner as the first amplifying stage 1, and respective similar circuit elements have reference numerals which are increased by one hundred as compared with their counterparts in the first stage. The second stage 100 differs from the first stage in that it does not include a peaking capacitor or a pinch resistor. A forward biased diode 170 is coupled between the emitter resistor 169 and ground. This diode cooperates with the amplifying and buffer transistors in the second stage to provide the collectors of transistors 10 and 12 with a 3 $V_{be}$ D.C. term for bias and temperature stabilization purposes. It may be seen that the collector of transistor 10 is D.C. biased by the base-emitter junctions of transistors 150 and 110, and the junction of diode 170. Similarly, the collector of transistor 12 is D.C. biased by the base-emitter junctions of transistors 152 and 112, and the junction of diode 170.

The construction and operation of the first and second amplifying stages 1 and 100 is described in detail in my copending United States Patent Application Ser. No. 143,032, entitled "VARIABLE LOAD IMPEDANCE GAIN-CONTROLLED AMPLIFIER", filed Apr. 23, 1980, the subject matter of which is incorporated by reference. There it is explained that the gain of the amplifying stages is varied by varying the voltage and hence the current supplied to the variable impedance devices 14, 16 and 114, 116. Under maximum gain conditions, little or no current is supplied to the devices, and their base-to-emitter A.C. impedance is relatively high. The device impedance is in parallel with a respective collector load resistor 18, 20, 118 or 120, which combined impedance determines the load line of the amplifier. As the I.F. signal supplied to the amplifiers increases in amplitude, the current supplied to the variable impedance devices by the AGC system 40 also increases. This causes the base-to-emitter impedance of the devices to decrease, as charge is stored in the base-emitter regions of the devices. The decreased impedance of the devices reduces the collector impedance of the amplifying transistors 10, 12, 110, 112, which shifts their load lines to a lower gain condition. When the amplifying stages are in a full gain-reduced condition, the current supplied to the variable impedance devices is at a maximum value, which is of the order of several milliamperes. The primary current paths for the current supplied by the AGC system 40 is through the emitter-to-collector paths of the variable impedance devices 14, 16, 114 and 116. Thus, substantially no D.C. gain control current from the AGC system flows in the collectors of the amplifying transistors 10, 12, 110 and 112. The D.C. biasing of the amplifying transistors is therefore substantially constant as the ranges of gain control of the amplifying stages are traversed.

The collectors of the second stage amplifying transistors 110 and 112 are respectively direct current coupled to the bases of buffer transistors 250 and 252 of the third amplifying stage 200. The collectors of buffer transistors 250 and 252 are coupled to receive bias voltage from the bias supply 70, and their emitters are returned to ground by resistors 254, 256 and 258. The emitters of buffer transistors 250 and 252 are also coupled to the bases of amplifying transistors 210 and 212, respectively.

The collectors of the amplifying transistors 210 and 212 are coupled to the bias supply 70 by way of respective load resistors 218 and 220. The emitters of the amplifying transistors 210 and 212 are returned to ground through resistors 262, 264 and 266. A forward biased diode 270 is coupled between resistor 266 and ground. Diode 270 performs a similar function as that of diode 170, as it cooperates with the buffer and amplifying transistors 250, 252, 210 and 212 to provide the collectors of the second stage amplifying transistors 110 and 112 with a quiescent D.C. voltage term of 3 $V_{be}$.

A resistor 260 is coupled between the emitters of transistors 210 and 212. The emitters of transistors 210 and 212 are also coupled to the bases of respective variable impedance devices 214 and 216. The collectors of the variable impedance devices 214 and 216 are coupled to ground, and their emitters are coupled to receive gain control current from AGC system 40 by way of a resistor 222.

The third amplifying stage 200 is constructed and operates in a similar manner as the amplifier described in my copending United States Patent Application Ser. No. 143,035, entitled "VARIABLE EMITTER DEGENERATION GAIN-CONTROLLED AMPLIFIER," filed Apr. 23, 1980, which is incorporated by reference. Briefly, the emitter resistance of each amplifying transistor includes one-half of the value of resistor 260 (due to the complementary operation of the amplifying transistors in response to push-pull I.F. signals), in parallel with the base-to-emitter impedance of a variable impedance device and a further bias resistor. The variably impedance devices 214 and 216 may be constructed in the same manner as variable impedance devices 14, 16, 114 and 116, and are characterized by a base-to-emitter A.C. impedance which decreases as the current supplied to them by the AGC system 40 increases. For the maximum gain condition of the third amplifying stage 200, the current supplied to the variable impedance devices is at a maximum. This provides a low emitter impedance to the amplifying transistors 214 and 216, causing a relatively low level of emitter degeneration. As the gain control range of the amplifier is traversed toward its minimum gain condition, the current supplied to the variable impedance devices is decreased, which increases the A.C. impedance presented to the amplifying transistors by the devices. The emitter degeneration is increased, and hence the gain of the amplifier is reduced. As in the case of the variable impedance devices described previously, the primary current path for the control current supplied by the AGC system 40 is through the emitter-to-collector paths of devices 214 and 216, which minimizes changes in the D.C. biasing of the amplifying transistors 210 and 212 as the gain control range of the amplifier is traversed.

The use of collector-controlled variable load line gain control in the first two amplifying stages and controlled emitter degeneration in the third stage reduces the maximum amount of current required for gain control and therefore the power dissipation in the I.F. amplifier system. Control current is supplied to the variable impedance devices of the first two stages by way of a common terminal 42 of the AGC system 40. The gain of these two stages is reduced by increasing the flow of control current. Control current is supplied to the variable impedance devices of the third stage by way of a separate terminal 44. The gain of this stage is reduced by decreasing the flow of control current from the AGC system 40 to the third stage. An advantageous sequence of gain control for the illustrated embodiment is described in my copending United States Patent Application Ser. No. 163,143, entitled "TELEVISION INTERMEDIATE FREQUENCY AMPLIFIER", concurrently filed herewith.

An amplified I.F. signal is developed across the collector load resistors 218 and 220, and is applied to a video detector 400 from the collectors of transistors 210 and 212 by way of transistors 301 and 303. Transistors 301 and 303 are coupled in emitter follower configurations, with their collector coupled to receive a supply potential from bias supply 70, and their emitters coupled to ground by respective resistors 304 and 306. These transistors buffer the load resistors 218 and 220 of the third amplifying stage 200 from the input impedance of the video detector, and provide a low impedance drive at their emitters. The emitters of transistors 301 and 303 are also coupled to the feedback path 300. Transistors 301 and 303 provide a quiescent D.C. voltage term at the collectors of transistors 210 and 212 of 3 $V_{be}$, in combination with first stage transistors 10, 50, 12 and 52, through the feedback path 300.

The feedback path 300 is comprised of two D.C. paths, one for each side of the balanced amplifier configuration. A feedback path including serially coupled resistors 318, 314, 324 and 328 is coupled between the emitter of transistor 301 and the base of first stage transistor 52. A second feedback path including serially coupled resistors 310, 316, 326 and 330 is coupled between the emitter of transistor 303 and the base of transistor 50.

The feedback path 300 includes two decoupling networks which decouple the amplified output I.F. signals from the input of stage 1. A first decoupling network includes buffer resistors 310 and 318 and a capacitor 312, and the second decoupling network includes buffer resistors 314 and 316, and bypass capacitors 322 and 320. Resistors 310 and 318 isolate the output at the emitters of transistors 301 and 303 from capacitor 312. The capacitor 312 is coupled across the two D.C. paths to significantly attenuate the complementary I.F. signals which are produced on the two paths. Any remaining I.F. signal components which appear on the two plates of capacitor 312 are then applied to bypass capacitors 322 and 320 by buffer resistors 314 and 316, respectively. The bypass capacitors 322 and 320 will then shunt any remaining I.F. signal components to ground. The decoupling networks act as low pass filters for the I.F. signals, with breakpoints below the desired range of I.F. signals, so that substantially only D.C. signals are applied to buffer resistors 324 and 326. The values of the resistors are chosen so that the D.C. feedback signals are not attenuated beyond a level at which they will provide the desired amount of feedback compensation in the first stage 1.

It is seen that bypass capacitors 322 and 320 are each coupled between a D.C. path and ground, whereas the capacitor 312 of the first decoupling network is coupled between the two D.C. paths. The coupling of capacitor 312 is the preferred technique, since capacitors 322 and 320 bypass I.F. signals to ground, and capacitor 312 does not. The I.F. signals which are conducted by capacitors 322 and 320 will be conducted through the ground plane of the system until they cancel each other. If the ground points to which the capacitors are connected are in close proximity to each other, the ill effects resulting from ground plane conduction of the I.F. signals will be partially mitigated. However, adjacent location of the two capacitors 322 and 320 is not always possible, especially when the system is constructed in integrated circuit form, wherein other considerations may govern the placement of the two capacitors. In that case, the I.F. signals may contaminate undesirably large areas of the I.C. ground plane, resulting in undesirable I.F. signal coupling to other circuitry in the system through ground connections. This problem is eliminated through the use of a capacitor coupled between the two D.C. paths, as is capacitor 312, since no I.F. signals are coupled to the ground plane by this decoupling network. If desired, the second decoupling network, including resistors 314 and 316, and capacitors 322 and 320, may be dispensed with in an embodiment of the illustrated arrangement, depending upon the level of I.F. signal cancellation desired and provided by the first decoupling network.

Buffer resistors 324 and 326 are coupled to the input transistors 52 and 50 by way of terminals 334 and 332 and isolation resistors 328 and 330, respectively. A further bypass capacitor 333 is coupled between terminals 332 and 334. The isolation resistors 328 and 330 serve to isolate the inputs to the first amplifying stage 1 from bypass capacitor 333. The bypass capacitor 333, together with resistors 324, 314, 318, and 326, 316, 310, determine the 3 db point of the I.F. amplifier and feedback loop, to assure system stability.

At maximum gain, the I.F. amplifying stages shown in the illustrated embodiment will have a gain of approximately 60 db. The system bandwidth is assumed to be approximately 100 MHz. In order to assure that the system will be stable, the phase and gain of the signal which is fed back from the third to the first stage must be controlled to prevent system oscillation. System oscillation will be prevented as long as the loop phase delay does not approach an even multiple of 180 degrees at any frequency at which the loop gain is equal to or greater than unity.

The I.F. signals which are applied to input terminals 32 and 34 undergo a phase reversal in each I.F. amplifying stage. If the I.F. system had unlimited bandwidth, the I.F. signals at the output of the third stage would be 180 degrees out of phase with respect to the input signals, thus readily providing a negative feedback signal. However, the system is assumed to have a limited bandwidth of 100 MHz, which introduces some phase delay into the amplified I.F. signals. This phase delay may only amount to a few degrees at low frequencies, but can amount to 80 degrees or more at I.F. frequencies around 50 MHz. The output I.F. signals will undergo even further delay in the decoupling networks of the feedback path. If the additional feedback delay should cause the signals to have a net delay which approaches an even multiple of 180 degrees around the loop at any frequency, the feedback will be positive and the system will be subject to oscillation at that frequency.

The value of capacitor 333 is chosen in combination with the values of resistors 324, 314, 318, and 326, 316, 310 to establish a pole at a frequency which is referred to as the 3 db frequency. Above the 3 db frequency, the amplitudes of higher frequency signal components will roll off at approximately 6 db per octave, or 20 db per decade of frequency. If the rolloff were chosen to be greater, such as 18 db per octave, each additional db of attenuation will cause the phase shift of the feedback path to increase proportionately, so that the feedback path phase shift will rapidly approach 180 degrees at higher frequencies, which could lead to oscillation at these higher frequencies.

The placement of the pole at the 3 db frequency must guarantee no greater than unity gain at all frequencies above a higher, unity gain frequency and including the I.F. frequency range about 50 MHz, which permits phase shifts in that frequency range to be neglected. For purposes of illustration, assume that the loop including the amplifiers and the feedback path provides 6 degrees of phase shift at 1 MHz, (plus the three signal inversions of the three amplifiers, which will be assumed to be present at all frequencies). Further assume that the feedback 3 db pole is located at 1 KHz, and provides a rolloff of 6 db per octave, or 20 db per decade. This rolloff will therefore provide 20 db of attenuation at 10 KHz, 40 db of attenuation at 100 KHz, and 60 db of attenuation at 1 MHz. Frequencies greater than 1 MHz will be attenuated by more than 60 db. Since the maximum gain of the amplifying stages is assumed to be 60 db, the 1 MHz frequency is the unity gain frequency for the amplifier and feedback loop. Although the delay in the 1 to 50 MHz range varies from 6 degrees to upwards of 80 degrees, the feedback attenuation is greater than 60 db over this range, which prevents loop gain of unity or greater over the range. Thus, one of the criteria for oscillation, unity gain, is not met, and the system will not oscillate at frequencies within this range. Furthermore, at frequencies below 1 MHz, the phase shift of the feedback path is 6 degrees or less, which prevents the occurrence of loop phase shifts approaching an even multiple of 180 degrees, which is the second condition necessary for oscillation. Therefore, the system is seen to be stable for a 1 KHz 3 db pole and a rolloff of 6 db per octave.

Unlike the prior art I.F. amplifier system described previously, the I.F. amplifier of the present invention does not require an additional amplifier in the feedback path 300. This additional amplifier was needed in the prior art arrangement because that arrangement is characterized by low D.C. gain due to the exclusive use of emitter degeneration type amplifying stages. As the gain of those stages is reduced, the D.C. gain is also reduced, and hence the additional amplifier is required to amplify the D.C. feedback signal. Of the three amplifying stages of the present invention, only the third stage uses emitter degeneration gain control. The third stage D.C. gain is dominated by the emitter resistors 260, 262 and 264, which gives the third stage a high input impedance and a low frequency gain of approximately 10 db. The first and second amplifying stages, which rely upon load line variation for gain control, have respective D.C. gains of approximately 20 db. The D.C. gain of the three cascaded states is fairly constant over the full range of gain control, and has been found to vary by no more than 6 db over the range. This stability in D.C. gain is attributed to the nonvarying D.C. biasing of the amplifying stages, as a result of the use of variable impedance devices, the control of which does not substantially affect the D.C. biasing of the amplifying transistors.

What is claimed is:

1. A feedback stabilized television intermediate frequency amplifier system comprising:
    an automatic gain control system for supplying a gain control signal;
    a plurality of gain controlled differential amplifiers direct current coupled in a cascade configuration for amplifying intermediate frequency signals, each of said amplifiers being coupled to said automatic gain control system and responsive to said gain control signal for varying the intermediate frequency signal gain of each of said amplifiers, the D.C. biasing of at least one of said amplifiers being substantially invariant to changes of said gain control signal, the first of said cascade coupled amplifiers including first and second differentially coupled amplifying transistors having base electrodes coupled to respective first and second input terminals, and the last of said cascade coupled amplifiers including third and fourth differentially coupled amplifying transistors having respective collector electrodes comprising first and second output electrodes of said amplifying system; and
    a first D.C. feedback path coupled between said first output electrode and said first input terminal, and a second D.C. feedback path coupled between said second output electrode and said second input terminal, said feedback paths each exhibiting a voltage gain not greater than unity over a range of frequencies including D.C. and said television intermediate frequencies.

2. The feedback stabilized television intermediate frequency amplifier system of claim 1,
    wherein said cascade coupled amplifiers and said first and second feedback paths comprise an amplifier and feedback loop, and
    wherein said first D.C. feedback path comprises first, second and third resistors serially coupled between said first output electrode and said first input terminal, and said second D.C. feedback path comprises fourth, fifth and sixth resistors serially coupled between said second output electrode and said second input terminal; and further comprising
    a first bypass capacitor coupled between the junction of said second and third resistors and the junction of said fifth and sixth resistors for providing a loop gain which is less than unity at said television intermediate frequencies; and
    a second bypass capacitor coupled between the junction of said first and second resistors and the junction of said fourth and fifth resistors, said second bypass capacitor and said first and fourth resistors forming a decoupling network for decoupling said output electrodes from said input terminals.

3. The feedback stabilized television intermediate frequency amplifier system of claim 2, further comprising:
    a video detector having first and second input terminals;
    a fifth transistor having a base coupled to said first output electrode and an emitter coupled to said first resistor and said first input terminal of said video detector; and
    a sixth transistor having a base coupled to said second output electrode and an emitter coupled to said fourth resistor and said second input terminal of said video detector,
    wherein said fifth and sixth transistors buffer said output electrodes from said input terminals of said video detector.

4. The feedback stabilized television intermediate frequency amplifier system of claim 2, wherein the phase shift around said amplifier and feedback loop is substantially equal to an odd multiple of 180 degrees for frequencies at which the gain of said amplifier and feedback loop is equal to or greater than unity.

5. A feedback stabilized television intermediate frequency amplifying system comprising:
    a first amplifying stage including first and second amplifying transistors coupled in a differential amplifier configuration, a first resistor coupled between the collector of said first transistor and a source of supply potential and passing a first direct current therebetween, a second resistor coupled between the collector of said second transistor and a source of supply potential and passing a second direct current therebetween, and means direct current coupled in shunt with said first and second resistors and responsive to variations of a first gain control current for causing gain variations for said first amplifying stage with negligible disturbance of the magnitude of said first and second direct currents; and a second amplifying stage direct current coupled in cascade with said first amplifying stage, and including third and fourth amplifying transistors coupled in a differential amplifier configuration, a third resistor coupled between said emitter of said third transistor and a point of signal reference potential and passing a third direct current therebetween, a fourth resistor coupled between said emitter of said fourth transistor and a point of signal reference potential and passing a fourth direct current therebetween, and means direct current coupled in shunt with said third and fourth resistors and responsive to variations of a second gain control current for causing gain variations for said second amplifying stage with negligible disturbance of the magnitude of said third and fourth direct currents; and a first D.C. feedback path coupled between the collector of said third transistor and the base of said first transistor, and a second D.C. feedback path coupled between the collector of said fourth transistor and the base of said second transistor, said feedback paths each exhibiting a voltage gain not greater than unity over a range of frequencies including D.C. and said television intermediate frequencies.

6. The feedback stabilized television intermediate frequency amplifier system of claims 1 or 5, wherein said differential amplifiers and said first and second D.C. feedback paths comprise a D.C. feedback amplifier loop exhibiting a loop voltage gain not greater than unity over a first range of frequencies including said television intermediate frequencies and a loop phase shift which is approximately equal to 180 degrees over a second range of frequencies located between D.C. and said first range of frequencies.

* * * * *